United States Patent [19]
Yoneda

[11] Patent Number: 5,315,552
[45] Date of Patent: May 24, 1994

[54] MEMORY MODULE, METHOD FOR CONTROL THEREOF AND METHOD FOR SETTING FAULT BIT TABLE FOR USE THEREWITH

[75] Inventor: Hideki Yoneda, Yachiyo, Japan
[73] Assignee: Kawasaki Steel Corporation, Hyogo, Japan
[21] Appl. No.: 934,235
[22] Filed: Aug. 25, 1992

[30] Foreign Application Priority Data
Aug. 29, 1991 [JP] Japan ............... 3-244639

[51] Int. Cl.⁵ .................................. G11C 13/00
[52] U.S. Cl. ............................ 365/200; 365/63
[58] Field of Search ............ 365/52, 63, 172, 200

[56] References Cited
U.S. PATENT DOCUMENTS

| | | | |
|---|---|---|---|
| 4,426,688 | 1/1984 | Moxley | 365/200 |
| 4,450,559 | 5/1984 | Bond et al. | 365/200 X |
| 4,453,248 | 6/1984 | Ryan | 365/200 X |
| 4,483,001 | 11/1984 | Ryan | 365/200 X |
| 4,488,298 | 12/1984 | Bond et al. | 365/200 X |

FOREIGN PATENT DOCUMENTS
61-180350 8/1986 Japan .
3-191450 8/1991 Japan .

Primary Examiner—Eugene R. LaRoche
Assistant Examiner—Do Hyun Yoo
Attorney, Agent, or Firm—Oliff & Berridge

[57] ABSTRACT

A memory module implementing a desired memory capacity by use of a plurality of memory chips. The memory module has a fault bit substituting device that compensates for fault bits detected in any of the memory chips. This improves the yield of the memory module and lowers the production costs thereof without recourse to expensive equipment such as wafer processors.

9 Claims, 5 Drawing Sheets

FIG. 4

| VALID | FAULT ADDRESS | SUBSTITUTE WORD MEMORY ADDRESS |
|---|---|---|
| 1 | 00020 | 0 |
| 1 | 001AF | 1 |
| 1 | 00FAC | 2 |
| 1 | 00119 | 3 |
| 0 |  | 4 |
| 0 |  | 5 |
| 0 |  | 6 |
| 0 |  | 7 |
| 0 |  | 8 |
| 0 |  | 9 |
| 0 |  | A |
| 0 |  | B |
| 0 |  | C |
| 0 |  | D |
| 0 |  | E |
| 0 |  | F |

| VALID | FAULT ADDRESS | FAULT BIT | SUBSTITUTE BIT MEMORY ADDRESS |
|---|---|---|---|
| 1 | 00020 | 1 | 0 |
| 1 | 001AF | 3 | 1 |
| 1 | 00FAC | 1 | 2 |
| 1 | 00119 | 5 | 3 |
| 0 | | | 4 |
| 0 | | | 5 |
| 0 | | | 6 |
| 0 | | | 7 |
| 0 | | | 8 |
| 0 | | | 9 |
| 0 | | | A |
| 0 | | | B |
| 0 | | | C |
| 0 | | | D |
| 0 | | | E |
| 0 | | | F |

FIG. 5

MEMORY MODULE, METHOD FOR CONTROL THEREOF AND METHOD FOR SETTING FAULT BIT TABLE FOR USE THEREWITH

BACKGROUND OF THE INVENTION

1. Field of the Invention

The present invention relates to a memory module that realizes a desired memory capacity using a plurality of memory chips. More particularly, the invention relates to a memory module offering a high yield and reduced costs, a method for control of that memory module, and a method for setting a fault bit table for use with that memory module.

2. Prior Art

Memory chips made of semiconductor integrated circuits are known to develop fault bits for diverse reasons during their production process.

The presence of fault bits is circumvented conventionally by equipping individual memory chips with redundant circuits. To compensate for the fault bits, a laser trimming machine commonly called a wafer processor is used at wafer die sort time to cut polycrystal Si or Al parts by laser melting and to connect polycrystal Si parts for conduction by later annealing while each memory chip is being tested.

One disadvantage of the above prior art measure is that wafer processors are very expensive (they often cost a few hundred million yen per unit).

Another disadvantage of the prior art is a poor throughput due to the fact that the fault bits are compensated while the addresses of each memory chip are being tested sequentially. In the case of a one-megabit DRAM (dynamic random access memory), it typically takes several minutes to compensate for the fault addresses of each chip by wafer processor.

Most memories are supplied and used in the form of memory modules (including memory boards and memory cards). Conventionally, memory modules are each composed of the necessary number of fault-free chips. One defective memory chip within a module means a totally disabled address area of that memory chip. In many cases, the module containing even one defective chip is discarded in total as useless. Therefore usually the memory module consists of only good chips.

A solution to the above problem of one chip disabling the entire module is disclosed by Japanese Patent Laid Open No. 61-180350. The disclosure involves adding at least one reserve memory chip to the memory module so that if a memory chip therein malfunctions, the defective chip is replaced by a reserve chip. The setup is called a field programmable logic array (FPLA).

Another solution to the problem above is disclosed by Japanese Patent Laid-Open No. 3-191450. The disclosure proposes furnishing a plurality of memory chips including at least one reserve chip amounting to N chips that constitute the memory module. In operation, only n chips (n<N) are used. If a faulty chip develops among the operating chips, that faulty chip is replaced by one of the remaining fault-free chips (N−n).

Both of the above solutions involve replacing each faulty chip with one good memory chip. Considering the fact that even a faulty memory chip contains numerous parts that are still good, the waste involved is enormous. Needless to say, all memory chips replacing the defective must be entirely fault-free chips.

SUMMARY OF THE INVENTION

It is therefore an object of the present invention to overcome the above-described drawbacks and disadvantages and to provide a memory module offering a high yield and reduced costs without using such expensive equipment as wafer processors, a method for control of that memory module, and a method for setting a fault bit table for use with that memory module.

In carrying out the invention and according to one aspect thereof, there is provided a memory module providing a required memory capacity using a plurality of memory chips, the memory module comprising fault bit substituting means for detecting access to a fault bit and selecting a substitute bit for replacing the fault bit.

In a preferred structure according to the invention, the fault bit substituting means comprises: a fault address coincidence circuit for detecting access to a fault bit using a fault bit table; a fault bit substitute memory; and a selection control circuit for selecting, if the fault address coincidence circuit detects access to a fault bit, a substitute address within the fault bit substitute memory without supplying a selection signal to the memory chips, and for supplying the selection signal to the memory chips if the fault address coincidence circuit does not detect any access to a fault bit.

In another preferred structure according to the invention, the memory module is accessed in units of words each containing a predetermined number of bits, and the fault bit substituting means detects access to an address associated with a fault bit and selects a substitute word so as to replace the fault bit with the whole word.

In a further preferred structure according to the invention, the fault bit table stores table data in a field programmable memory or a field programmable logic array.

In a yet further preferred structure according to the invention, the fault bit table stores table data in a random access memory.

According to another aspect of the invention, there is provided a method for control of a memory module providing a required memory capacity using a plurality of memory chips, the method comprising the step of detecting access to a fault bit and selecting a substitute bit replacing the fault bit.

A preferred method for control according to the invention further comprises the steps of detecting access to a fault bit using a fault bit table; and selecting, if access to a fault bit is detected, a substitute address without supplying a selection signal to the memory chips, and supplying the selection signal to the memory chips if no access to a fault bit is detected.

In another preferred method for control according to the invention, the memory module is accessed in units of words each containing a predetermined number of bits, the method further comprising the step of selecting, if access to an address associated with the fault bit is detected, a substitute word so as to replace the fault bit with the whole word.

According to a further aspect of the invention, there is provided a method for setting a fault bit table in the memory module, the fault bit table having table data written thereto, the method comprising the steps of retaining information about the locations of fault bits per memory chip during testing of the memory chips; and writing the table data in the memory module through the use of the fault bit locations in each memory chip of the memory module.

This invention draws upon a memory module constitution having a plurality of memory chips made of semiconductor integrated circuits which amount to a required memory capacity.

The invention envisages equipping each memory module with fault bit substituting means for detecting access to a fault bit and selecting a substitute bit replacing the fault bit.

The fault bit substitute memory constituting part of the fault bit substituting means of the invention may be implemented using the same type of memory as that of memory chips in the module, such as a dynamic random access memory (DRAM), a static random access memory (SRAM), an erasable and programmable read only memory (EPROM) or an electrically erasable and programmable read only memory (EEPROM). If the memory chips in the memory module are of the dynamic random access memory (DRAM), the fault bit substitute memory may be implemented using a static random access memory (SRAM).

The fault address coincidence circuit constituting part of the fault bit substituting means may have its fault address settings field-programmable if composed of a field programmable logic array (PLA) or field programmable EPROM or EEPROM. If the fault address coincidence circuit utilizes a random access memory (RAM) such as SRAM or DRAM, the fault bits (i.e., fault addresses) may be set again during self-diagnosis of a computer system that uses the memory module according to the invention. That is, the bits that failed during operation of the computer system may also be compensated.

The invention is not limitative of how the fault bit substituting means is specifically implemented. The fault bit substituting means compensates for fault bits without the use of such expensive equipment as wafer processors.

The fault bit substituting means deals with a plurality of memory chips. This means that there is no need for each memory chip to contain redundant circuits individually. As a result, the degree of overall circuit integration is enhanced significantly.

The invention is not limitative of how the memory module is specifically implemented. The memory module may be either contained in a single package or built on a printed circuit board.

A major benefit of the invention is that the memory module according thereto is produced with a higher yield and lower costs without recourse to such expensive equipment as wafer processors. Memory chips tend to be inflated in their final price as one generation is followed progressively by another. The fault bit substituting means of the invention will substantially reduce the cost of memory chips down to the order of PLAs (field programmable logic arrays) when the chips are mass-produced. Thus when the price of one memory chip ranges from several thousand yen to tens of thousands of yen, the invention achieves cost reductions greater than the cost of implementing the fault bit substituting means by boosting the actual memory chip yield.

These and other objects, features and advantages of the invention will become more apparent upon a reading of the following description and appended drawings.

BRIEF DESCRIPTION OF THE DRAWINGS

The preferred embodiments will be described with reference to the drawings, wherein like elements have been denoted throughout the figures with like reference numerals, and wherein:

FIG. 4 is a schematic view of a typical fault bit table for use with the embodiment of FIG. 1; and FIG. 5 is a schematic view of another fault bit table for use with the embodiment of FIG. 1.

DESCRIPTION OF THE PREFERRED EMBODIMENTS

The preferred embodiments of the invention will now be described in detail with reference to the accompanying drawings.

Figure 1:
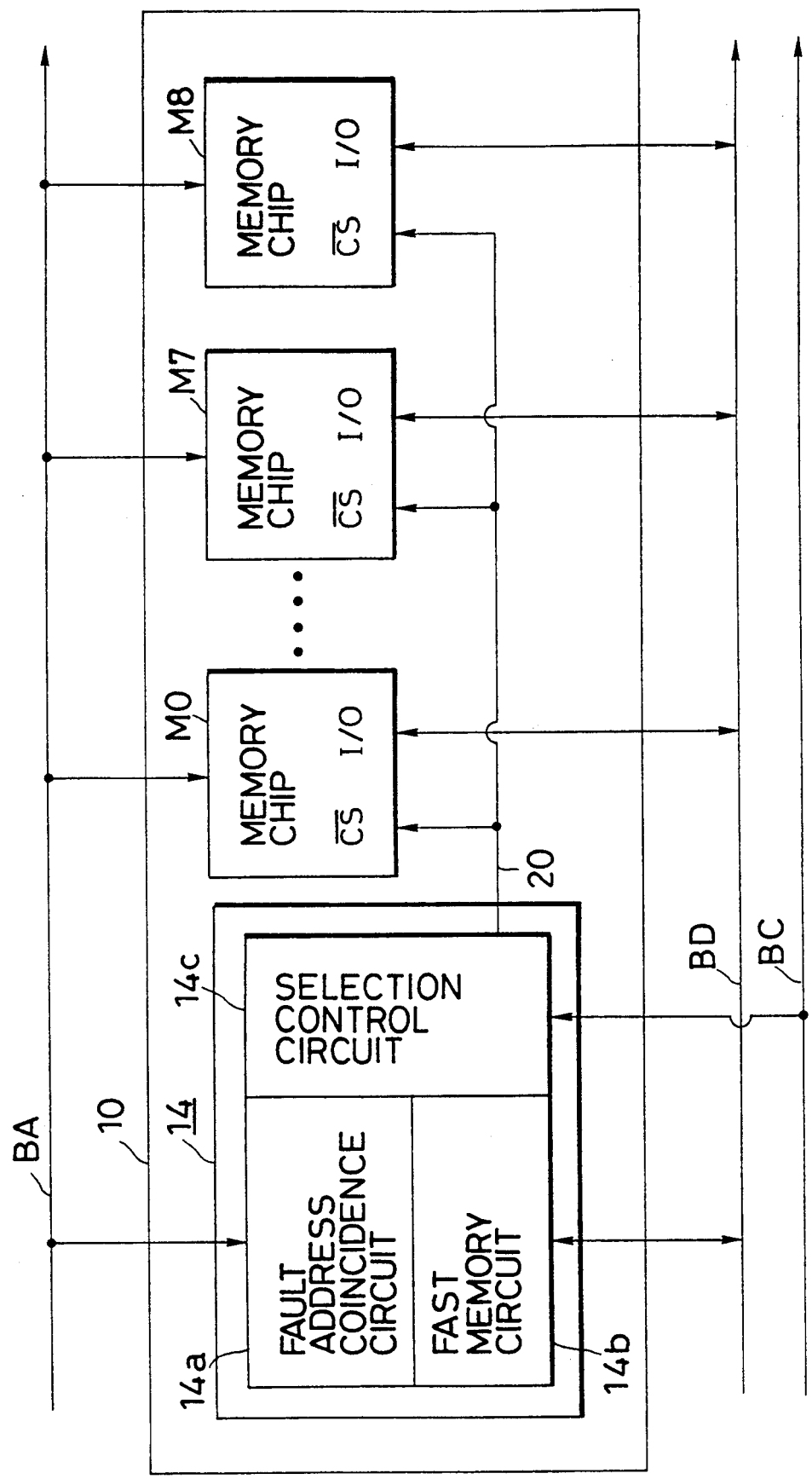
FIG. 1 is a block diagram of one preferred embodiment of the invention.

FIG. 1 is a block diagram of one preferred embodiment of the invention. In FIG. 1, a memory module 10 is constituted primarily by a total of nine memory chips M0 through M8 and a fault bit substituting device 14. The memory module 10 is accessed from the outside via an address bus BA, a data bus BD and a control bus BC.

Each of the memory chips M0 through M8 is a onemegabit DRAM. The nine chips form a memory of nine bits per word. When a selection signal 20 (negative logic of CS) is brought Low, access is gained to the address designated by the address bus BA through the bit data lines leading to I/O terminals of the chips.

Figure 2:
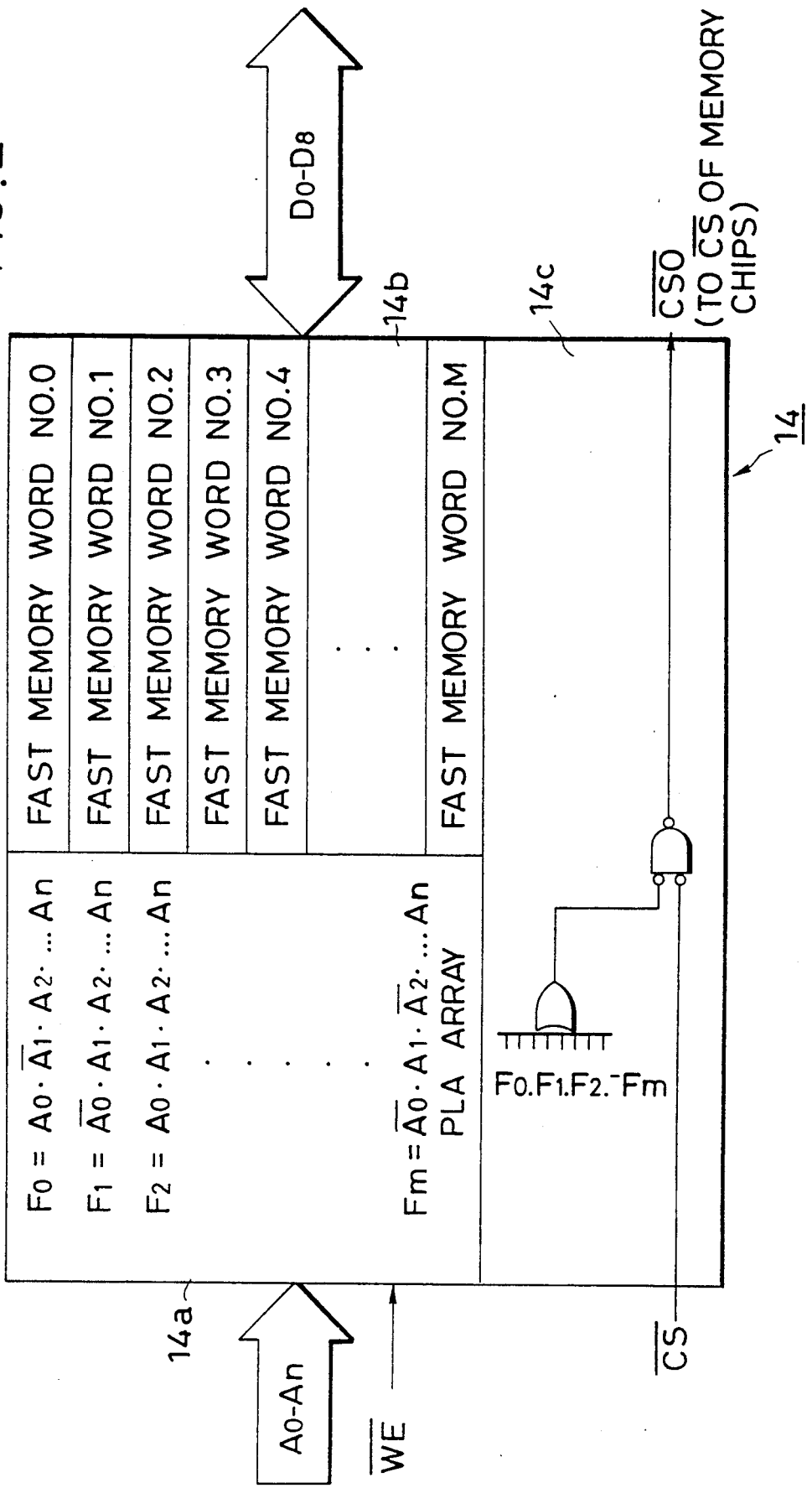
FIG. 2 is a block diagram of a fault bit substituting device for use with the embodiment of FIG. 1.

As shown in FIG. 2, the fault bit substituting device 14 is primarily made of a fault address coincidence circuit 14a, a fast memory circuit 14b and a selection control circuit 14c.

The fault address coincidence circuit 14a detects access to a fault bit using a fault bit table. Examples of the fault bit table are illustrated in FIGS. 4 and 5.

Figure 3:
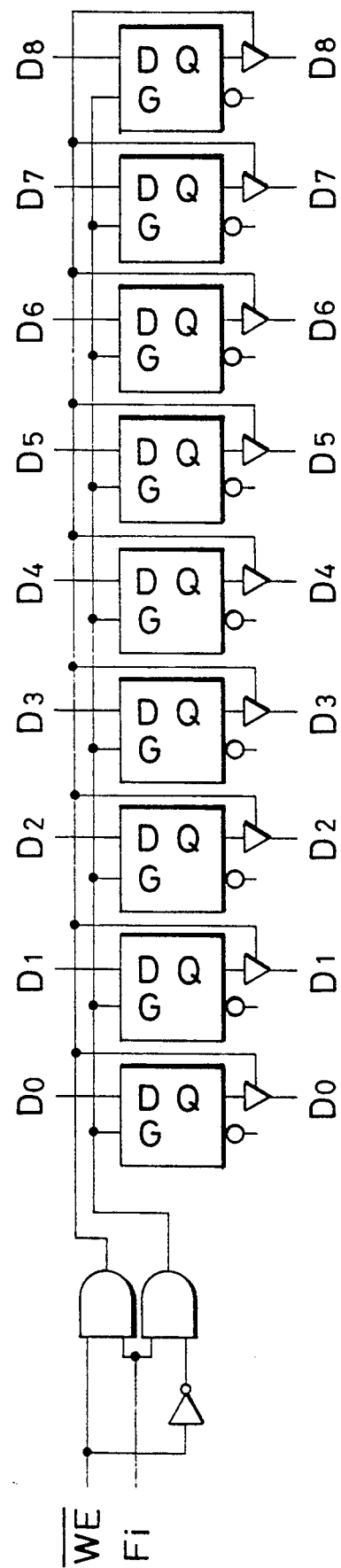
FIG. 3 is a circuit diagram of a single-word section in a typical fast memory circuit contained in the fault bit substituting device of FIG. 2.

The fast memory circuit 14b is a fault bit substitute memory that compensates for the fault bits detected in the memory chips M0 through M8. FIG. 3 shows a typical construction of the fast memory circuit in which as many D latch circuits as the number of data bits are connected in parallel for each word.

The selection control circuit 14c selects, if the fault address coincidence circuit 14a detects access to a fault bit, a substitute address of the fast memory circuit 14b for the fault bit without asserting a selection signal 20 (in high state $\overline{CSO}=H$) to any of the memory chips M0 through M8. If the fault address coincidence circuit 14a does not detect access to the fault bit and the address designated via the address bus BA corresponds to any of the memory chips M0 through M8, the selection control circuit 14c asserts the selection signal 20 (in low state $\overline{CSO}=L$) to any of the memory chips M0 through M8.

FIG. 2 is a block diagram of the fault bit substituting device 14 for use with the embodiment. Each of the memory chips M0 through M8 is assumed here to be an SRAM for the sake of descriptive simplicity. For this embodiment, the fault address coincidence circuit 14a is implemented as a PLA arrangement. The PLA is programmed beforehand so that when a fault address of any of the SRAMs contained in the memory module is input, one of signals F0 through Fm is set to "1".

Suppose that an input address has set the signal Fi to "1". In that case, a word i of the fast memory circuit 14b receives the signal Fi, and the circuit functions according to the value of $\overline{WE}$. That is, when $\overline{WE}$ is "0", the fast memory circuit 14b enters write mode. In write mode, the G input of the D latch in the fast memory circuit word i becomes "1" and the value on the data bus BD is written to the word i of the fast memory circuit 14b. When $\overline{WE}$ is "1", the fast memory circuit 14b enters read mode. In read mode, the value of the fast memory circuit word i is output onto the data bus BD. At this point, regardless of the value of $\overline{WE}$, a signal $\overline{CS}$ on the control bus BC is negated by the selection control circuit 14c to become a signal $\overline{CSO}$. This signal is output to $\overline{CS}$ input of the SRAM chips in the memory module, thereby disabling the SRAM chips.

FIG. 4 schematically shows a typical fault bit table for use with the embodiment. The fault bit table of this type is used by the fault address coincidence circuit 14a that has been described with reference to FIG. 1. This fault bit table comprises a "Valid" column, "Fault Address" column and a "Substitute Word Memory Address" column.

In the fault bit table above, the address designated by the address bus BA and coinciding with any one of the address values in the "Fault Address" column means that access to a fault bit has been detected. The fault address containing the detected fault bit as well as normal bits is replaced as a whole with a substitute word memory address in the fast memory circuit 14b.

For example, when the address "00FAC" is accessed via the address bus BA, the address "2" of the fast memory circuit 14b is used. In this case, even if only one bit is faulty at the address "00FAC," the entire eight bits (i.e., one word) are replaced.

FIG. 5 schematically depicts another fault bit table for use with the embodiment.

The difference between the fault bit table of FIG. 5 and that of FIG. 4 is that the table of FIG. 5 is supplemented by a "Fault Bit" column which is not included in the table FIG. 4. With the fault bit table of FIG. 5 in use, when access to a fault bit is detected through coincidence with an entry in the "Fault Address" column, that bit in the memory chips M0 through M8 which corresponds to the applicable entry in the "Fault Bit" column is replaced with a substitute bit memory address of the fast memory circuit 14b.

Where the fault bit table of FIG. 5 is utilized, only the fault bit at the fault address is substituted. This scheme contributes to reducing the required memory capacity of the fast memory circuit 14b.

On the other hand, where the fault bit table of FIG. 4 is employed, the fault bit table and the selection control circuit may be much simplified in their operation.

In the fault bit table of FIG. 4 or 5, the substitute bit memory addresses may be considered the same as the item numbers (i.e., numbers of the data items in the fault bit table). In that case, the "Substitute Bit Memory Address" column may be omitted from the table.

As described, the embodiment of the invention compensates for fault bits without recourse to expensive equipment such as wafer processors, whereby the yield of the memory module is enhanced and the production costs thereof are reduced.

Although the description above contains many specificities, these should not be construed as limiting the scope of the invention but as merely providing illustrations of some of the presently preferred embodiments of this invention. For example, the fault bit table of the fault address coincidence circuit 14a may have data written and read thereto and therefrom as needed by use of the address bus BA, control bus BC and data bus BD. Thus the table data such as fault addresses and fault bits in the fault bit table of FIG. 4 or 5 may be changed even after the memory module 10 is already incorporated in a computer system or the like. In case the computer system detects a fault bit during self-diagnosis upon start-up, table data in its fault bit table may be changed accordingly. In this case, the memory that stores the table data may be a volatile memory.

Each memory chip when produced is subject to the testing for fault bits. The results of the memory chip tests, i.e., the locations of fault bits in each memory chip tested, may be retained for subsequent setting of table data in the fault bit table of the embodiment. Utilizing the information about fault bit locations eliminates the need for rechecking each memory chip for fault bits when a fault bit table is to be established for an applied system.

In the course of production, memory module is tested in a final testing. Therefore, the table data can be set by results of the testing, i.e., by use of the locations of fault bits per memory chip discovered in the testing. The setting can be also conducted by a tester during the testing of the memory module. In this case, there is no need for retaining the information with regard to the locations of fault bits.

Given such modifications and alternatives to the present invention, the scope thereof should be determined by the appended claims and their logical equivalents, rather than by the examples described.

It is further understood by those skilled in the art that the foregoing description is a preferred embodiment of the disclosed device and that various changes and modifications may be made in the invention without departing from the spirit and scope thereof.

What is claimed is:

1. A memory module providing a required memory capacity using a plurality of memory chips, said memory module having fault bit substituting means for detecting access to a fault bit and selecting a substitute bit to replace the fault bit, wherein said fault bit substituting means comprises:

a fault address coincidence circuit for detecting access to the fault bit using a fault bit table;

a fault bit substitute memory; and a selection control circuit for selecting, if said fault address coincidence circuit detects access to the fault bit, a substitute address within said fault bit substitute memory without asserting a selection signal to said plurality of memory chips, the selection control circuit asserting said selection signal to said plurality of memory chips if said fault address coincidence circuit fails to detect access to the fault bit.

2. The memory module of claim 1, wherein said memory module is accessed in units of words, each word containing a predetermined number of bits, and wherein said fault bit substituting means detects access to an address associated with the fault bit and selects a substitute word to replace a word containing said fault bit with the substitute word.

3. The memory module of claim 1, wherein said fault bit table is a programmable logic array, the fault bit table selecting any one of a plurality of words in said fault bit substitute memory when a fault address of one of the plurality of memory chips is input.

4. The memory module of claim 1, wherein said fault bit table stores table data in a field programmable memory.

5. The memory module of claim 1, wherein said fault bit table stores table data in a random access memory.

6. A method for setting the fault bit table in the memory module of claim 1, said fault bit table having table data written into the fault bit table, said method comprising the steps of:

retaining information about a location of the fault bit in each of the plurality of memory chips during testing of said memory chips; and writing said table data into said memory module by using the fault bit location in each memory chip of said memory module.

7. A method for setting the fault bit table in the memory module of claim 1, said fault bit table having table data written into the fault bit table, said method comprising the step of:

writing said table data into said memory module by using a location of the fault bit of each of the plurality of memory chips discovered during testing of said memory module.

8. A method for setting the fault bit table in the memory module of claim 1, wherein said memory module is used in a computer system, said method comprising the step of:

rewriting said fault bit table by using a location of the fault bit of each of the plurality of memory chips, if any fault bit is detected through a memory diagnosis by said computer system.

9. A method for control of a memory module providing a required memory capacity using a plurality of memory chips, said method comprising the steps of:

detecting access to a fault bit using a fault bit table; and selecting a substitute bit for replacing said fault bit, wherein said selecting step selects, if access to the fault bit is detected, a substitute address without asserting a selection signal to said plurality of memory chips, and asserts said selection signal to said plurality of memory chips if no access to the fault bit is detected.

* * * * *